United States Patent
Yamato

(10) Patent No.: US 9,548,440 B2
(45) Date of Patent: Jan. 17, 2017

(54) CIRCUIT MODULE AND COMPOSITE CIRCUIT MODULE

(71) Applicant: Murata Manufacturing Co., Ltd., Nagaokakyo-shi, Kyoto-fu (JP)

(72) Inventor: Syuji Yamato, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 348 days.

(21) Appl. No.: 14/176,392

(22) Filed: Feb. 10, 2014

(65) Prior Publication Data

US 2014/0184019 A1 Jul. 3, 2014

Related U.S. Application Data

(63) Continuation of application No. PCT/JP2012/071209, filed on Aug. 22, 2012.

(30) Foreign Application Priority Data

Sep. 2, 2011 (JP) .................................. 2011-191471

(51) Int. Cl.
| | |
|---|---|
| *H03H 9/05* | (2006.01) |
| *H01L 41/053* | (2006.01) |
| *H03H 9/72* | (2006.01) |
| *H05K 3/36* | (2006.01) |
| *H05K 1/14* | (2006.01) |
| *H05K 3/28* | (2006.01) |
| *H05K 3/34* | (2006.01) |

(52) U.S. Cl.
CPC .......... *H01L 41/053* (2013.01); *H03H 9/0576* (2013.01); *H03H 9/725* (2013.01); *H05K 3/368* (2013.01); *H05K 1/141* (2013.01); *H05K 3/284* (2013.01); *H05K 3/3436* (2013.01); *H05K 2201/10083* (2013.01)

(58) Field of Classification Search
CPC .............. H03H 9/0576; H03H 9/02535; H03H 9/02834; H03H 9/08; H01L 41/053
USPC ...... 310/313 R, 313 A, 313 B, 313 C, 313 D
See application file for complete search history.

(56) References Cited

U.S. PATENT DOCUMENTS

| | | |
|---|---|---|
| 2003/0052413 A1 | 3/2003 | Kawai |
| 2004/0168824 A1 | 9/2004 | Sekido |
| 2004/0227431 A1 | 11/2004 | Mishima |

(Continued)

FOREIGN PATENT DOCUMENTS

| | | |
|---|---|---|
| JP | 11-302034 A | 11/1999 |
| JP | 2002-299996 A | 10/2002 |

(Continued)

OTHER PUBLICATIONS

Official Communication issued in corresponding Japanese Patent Application No. 2013-531234, mailed on Jun. 23, 2015.

(Continued)

*Primary Examiner* — Derek Rosenau
(74) *Attorney, Agent, or Firm* — Keating & Bennett, LLP

(57) ABSTRACT

A circuit module and a composite circuit module, which suppress or prevent damage to a connection to or within a device when heat is applied, includes a SAW filter including a piezoelectric substrate. In a package substrate that is a resin substrate, the SAW filter is mounted. A mounting substrate is a multilayer substrate mounted on a mother substrate, and the package substrate is mounted therein.

10 Claims, 8 Drawing Sheets

(56) References Cited

U.S. PATENT DOCUMENTS

| | | |
|---|---|---|
| 2005/0104196 A1 | 5/2005 | Kashiwazaki |
| 2008/0169724 A1* | 7/2008 | Bhattacharjee .... H03H 9/02574 310/313 B |
| 2010/0225202 A1* | 9/2010 | Fukano ................ H03H 9/1092 310/313 C |
| 2010/0271154 A1 | 10/2010 | Tsutsumi et al. |
| 2011/0018389 A1* | 1/2011 | Fukano ................ H03H 9/059 310/313 R |
| 2011/0193650 A1 | 8/2011 | Takenoshita et al. |
| 2012/0075002 A1 | 3/2012 | Uejima et al. |
| 2012/0182091 A1 | 7/2012 | Ookubo |

FOREIGN PATENT DOCUMENTS

| | | |
|---|---|---|
| JP | 2003-087091 A | 3/2003 |
| JP | 2004-120660 A | 4/2004 |
| JP | 2004-254287 A | 9/2004 |
| JP | 2004-266074 A | 9/2004 |
| JP | 2005-175423 A | 6/2005 |
| JP | 2006-108303 A | 4/2006 |
| JP | 3967990 B2 | 8/2007 |
| JP | 2010-21423 A | 1/2010 |
| JP | 2010-258586 A | 11/2010 |
| JP | 2011-010317 A | 1/2011 |
| WO | 2010/143472 A1 | 12/2010 |
| WO | 2011/065499 A1 | 6/2011 |

OTHER PUBLICATIONS

Official Communication issued in International Patent Application No. PCT/JP2012/071209, mailed on Oct. 16, 2012.

* cited by examiner

CIRCUIT MODULE AND COMPOSITE CIRCUIT MODULE

BACKGROUND OF THE INVENTION

1. Field of the Invention

The present invention relates to a circuit module and a composite circuit module, and more specifically, relates to a circuit module and a composite circuit module, which include surface acoustic wave filters including piezoelectric elements.

2. Description of the Related Art

As a circuit module of the related art, an electronic component device described in, for example, Japanese Unexamined Patent Application Publication No. 2002-299996 has been known. FIG. 9 is the cross-sectional structural view of an electronic component device 500 described in Japanese Unexamined Patent Application Publication No. 2002-299996.

The electronic component device 500 includes a SAW device 502 and a base substance 504. The SAW device 502 includes a piezoelectric single crystal substrate 506 and a comb-shaped electrode 508. The comb-shaped electrode 508 is provided on the piezoelectric single crystal substrate 506. The SAW device 502 is mounted on the base substance 504 through bumps so that the comb-shaped electrode 508 faces the base substance 504. The electronic component device 500 configured in such a way as described above is mounted in, for example, a mother substrate and used.

Incidentally, when the electronic component device 500 is heated or cooled in a reflow process or the like, there is a possibility that a connection to or within the device may be damaged. In more detail, in the electronic component device 500, the piezoelectric single crystal substrate 506 is manufactured using, for example, lithium tantalate. In addition, the base substance 504 is manufactured using, for example, a ceramic such as aluminum oxide. In addition, the mother substrate is manufactured using, for example, a glass epoxy resin. The lithium tantalate, the aluminum oxide, and the glass epoxy resin are different from one another in material properties such as a coefficient of linear expansion and a Young's modulus. Therefore, when the electronic component device 500 has been heated or cooled in the reflow process or the like, different deformations may occur in the SAW device 502, the base substance 504, and the mother substrate. As a result, there is a possibility that a connection to or within the electronic component device 500 may be damaged. Using a computer simulation, the present inventor ascertained that a connection between the SAW device 502 and base substance 504 has a special propensity to be damaged.

SUMMARY OF THE INVENTION

Therefore, preferred embodiments of the present invention provide a circuit module and a composite circuit module, which are capable of suppressing or preventing damage to a connection to or within a device that may occur at a time of heating or cooling.

A circuit module according to a preferred embodiment of the present invention includes a surface acoustic wave filter including a piezoelectric substrate, a resin substrate in which the surface acoustic wave filter is mounted, and a multilayer substrate that is mounted on a mother substrate and in which the resin substrate is mounted.

A composite circuit module according to a preferred embodiment of the present invention includes the circuit module, and a mother substrate in which the circuit module is mounted.

According to various preferred embodiments of the present invention, it is possible to suppress or prevent damage to a connection to or within a device that may occur during heating or cooling.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a circuit module and a composite circuit module according to preferred embodiments of the present invention will be described with reference to drawings.

Figure 1A:
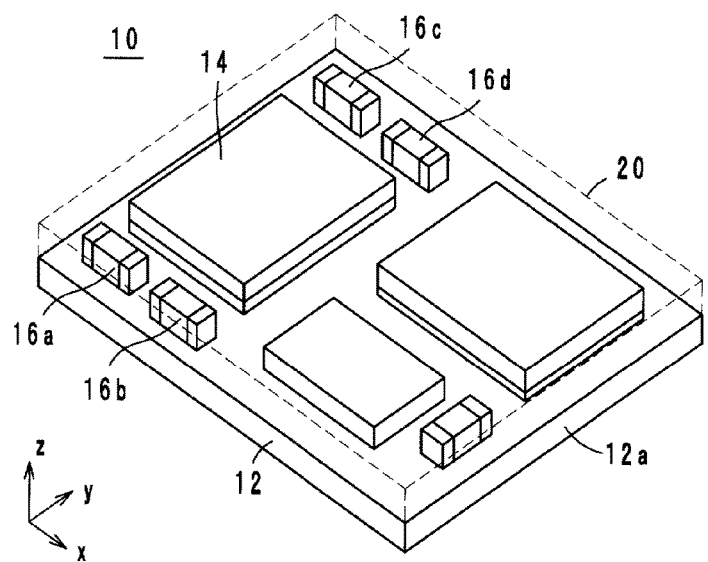
FIGS. 1A and 1B are appearance perspective views of a circuit module according to a preferred embodiment of the present invention.
Figure 1B:
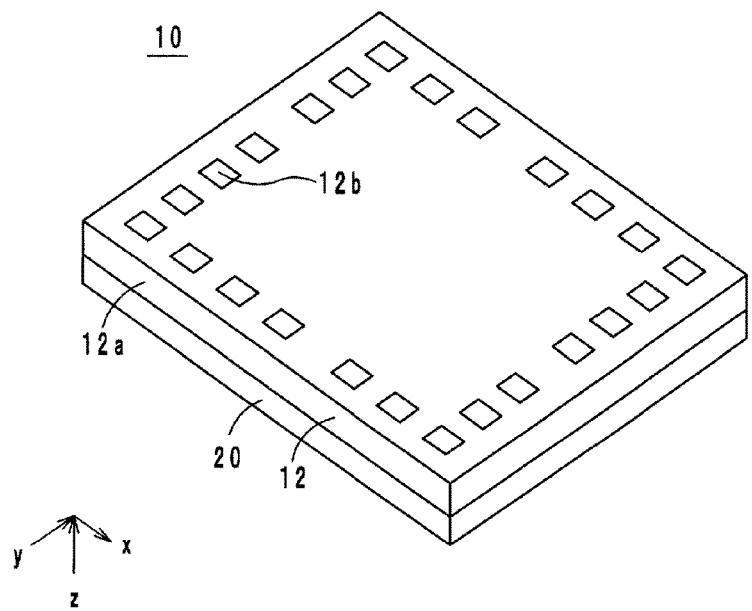
Figure 2:
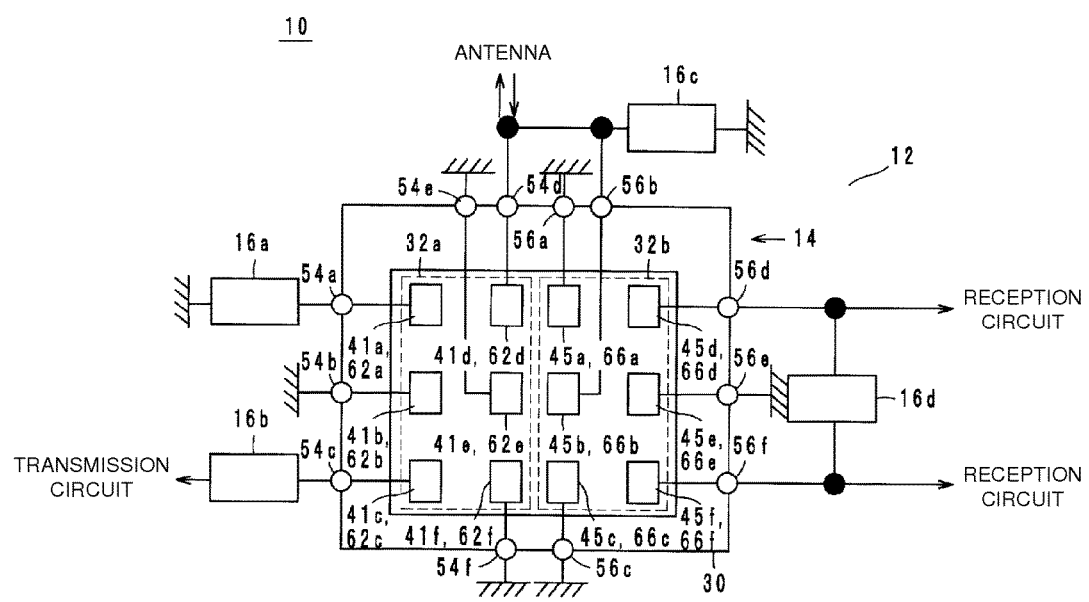
FIG. 2 is a diagram illustrating a circuit configuration of the circuit module in FIG. 1.
Figure 3:
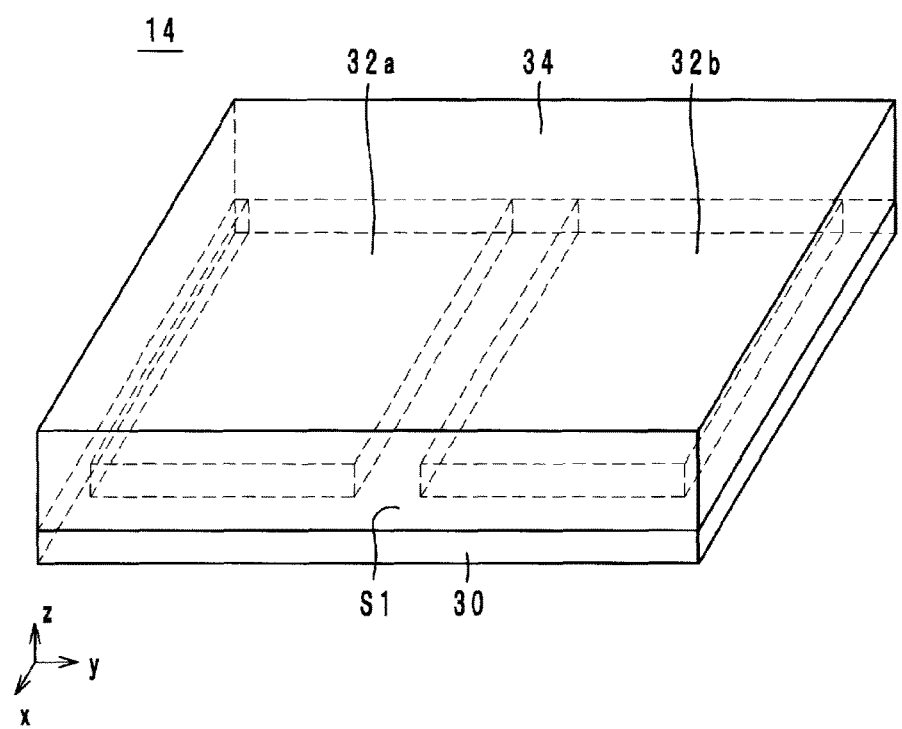
FIG. 3 is an appearance perspective view of a duplexer built into a circuit module.

Hereinafter, the configuration of a circuit module according to a preferred embodiment of the present invention will be described with reference to drawings. FIGS. 1A and 1B are appearance perspective views of a circuit module 10 according to a preferred embodiment of the present invention. FIG. 1A is a perspective view when the circuit module 10 is viewed from a positive direction side in a z-axis direction, and FIG. 1B is a perspective view when the circuit module 10 is viewed from a negative direction side in the z-axis direction. FIG. 2 is a diagram illustrating the circuit configuration of the circuit module 10 in FIG. 1. FIG. 3 is the appearance perspective view of a duplexer 14 built into the circuit module 10. In the following, in the circuit module 10 having a rectangular or substantially rectangular parallelepiped shape, a height direction is defined as the z-axis direction. In addition, a long side direction in a planar view in the z-axis direction is defined as an x-axis direction, and a short side direction is defined as a y-axis direction. An x-axis, a y-axis, and a z-axis are perpendicular to one another.

As illustrated in FIG. 1 and FIG. 2, the circuit module 10 includes a mounting substrate (multilayer substrate) 12, the duplexer 14, matching elements 16a to 16d, and a sealing resin 20. As illustrated in FIG. 1, the mounting substrate 12 is a rectangular or substantially rectangular multilayer circuit substrate including a plurality of insulator layers laminated on each other, and mounted on the mother substrate of a cellular phone. The mounting substrate 12 includes a substrate body 12a and a land electrode 12b. The substrate body 12a is, for example, a ceramic multilayer substrate formed using LTCC (Low Temperature Co-fired Ceramics) or the like. The land electrode 12b is provided on a main surface on the negative direction side in the z-axis direction, and used to mount the mounting substrate 12 to the mother substrate. In addition, the mounting substrate 12 further includes land electrodes (not illustrated) used to mount the duplexer 14 and the matching elements 16a to 16d.

The duplexer 14 is demultiplexing circuit that individually outputs, to reception circuits (not illustrated) provided in or on the mother substrate, reception signals having relatively high frequencies and being received by an antenna not illustrated, and outputs, to an antenna provided in or on the mother substrate, a transmission signal having a relatively low frequency and being output from a transmission circuit (not illustrated) provided in or on the mother substrate. As illustrated in FIG. 1, the duplexer 14 is mounted on the main surface of the mounting substrate 12 on the positive direction side in the z-axis direction, and includes a package substrate 30, SAW filters (surface acoustic wave filters) 32a and 32b, and a sealing resin 34, as illustrated in FIG. 3. In addition, the frequency of the transmission signal may also be higher than the frequency of the reception signal. In addition, the reception circuit and the transmission circuit may also be provided outside of the circuit module 10.

As illustrated in FIG. 2, the SAW filter 32a is provided between the transmission circuit and the antenna, and has a characteristic that causes a transmission signal having a relatively low frequency to pass from the transmission circuit to the antenna and does not cause a reception signal having a relatively high frequency to pass from the antenna to the transmission circuit. As illustrated in FIG. 2, the SAW filter 32b is provided between the antenna and the reception circuit, and has a characteristic that causes a reception signal having a relatively high frequency to pass from the antenna to the reception circuit and does not cause a transmission signal having a relatively low frequency to pass from the antenna to the reception circuit.

Figure 4:
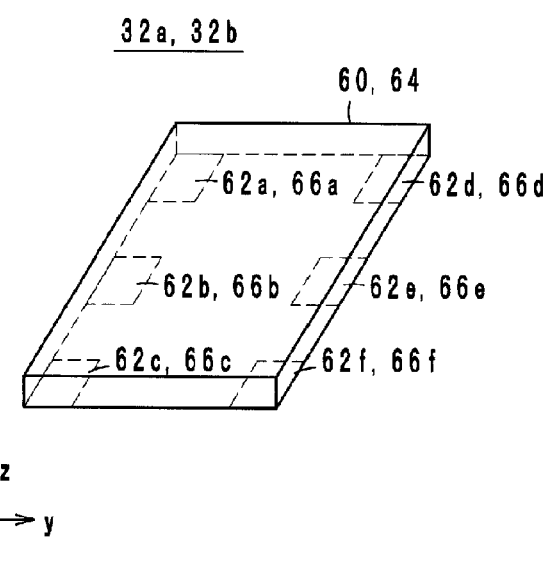
FIG. 4 is an appearance perspective view of a SAW filter.
Figure 5:
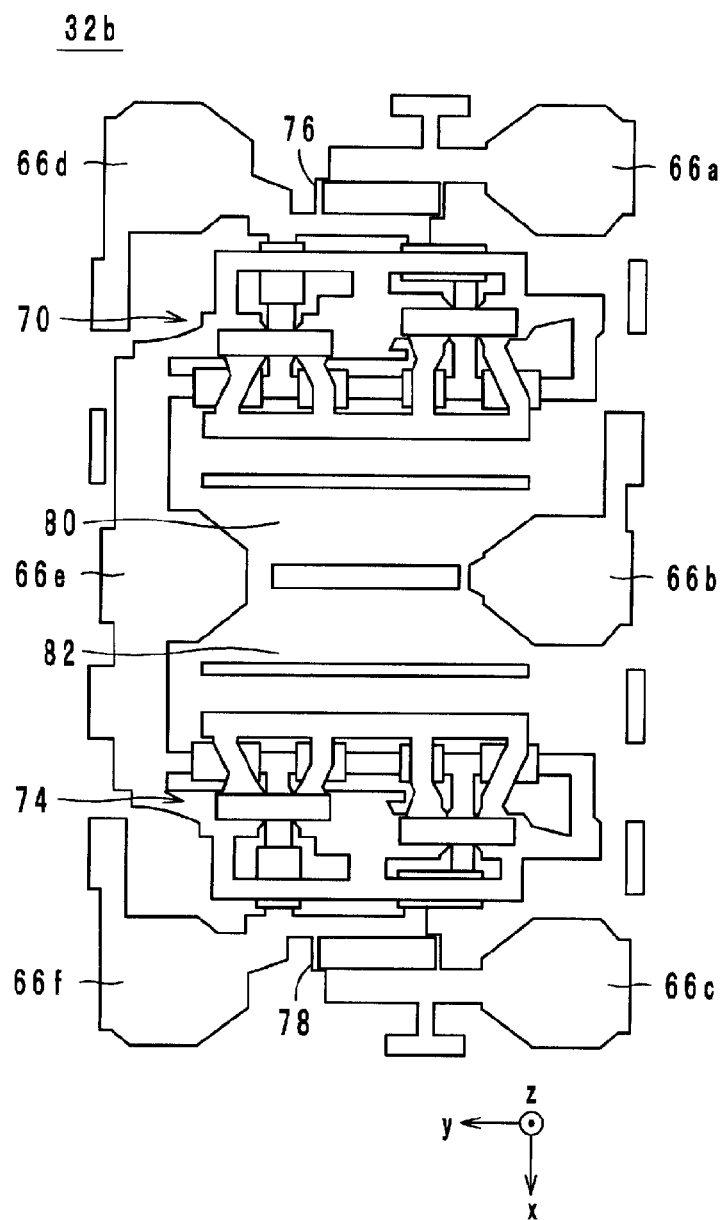
FIG. 5 is a diagram illustrating an internal configuration of a SAW filter.
Figure 6:
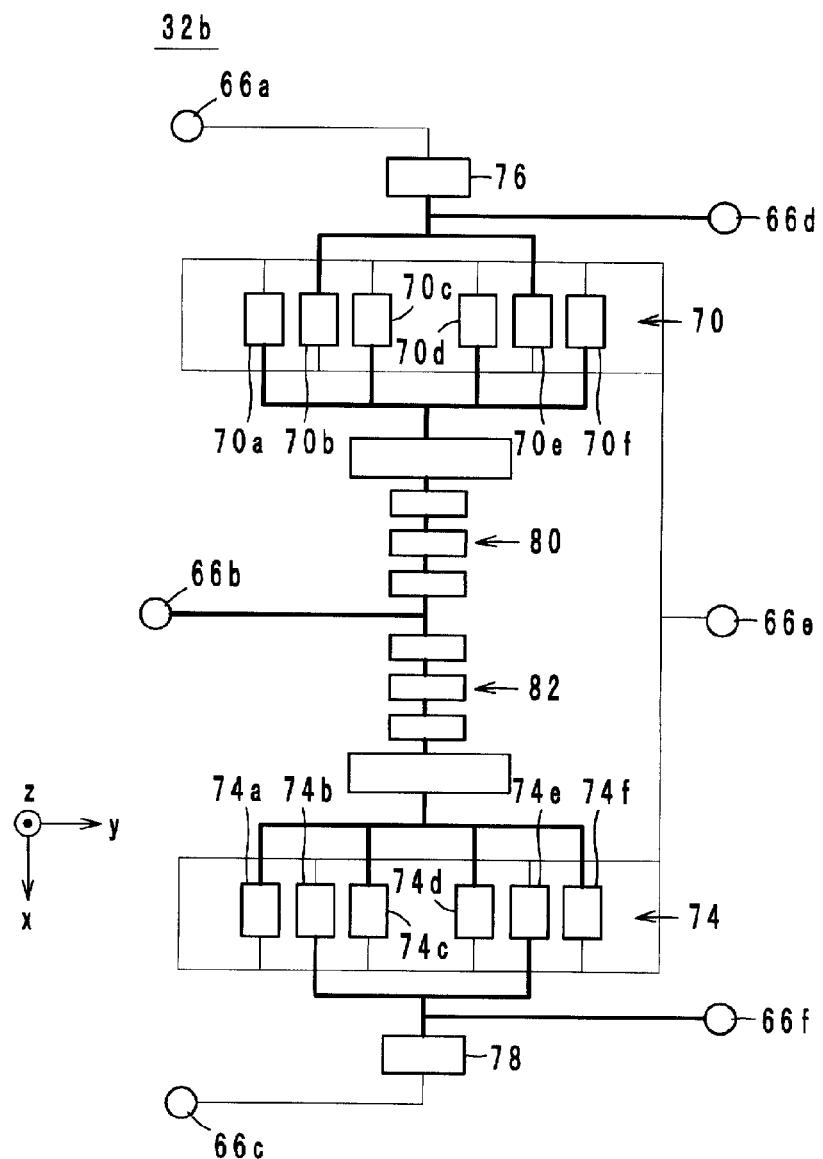
FIG. 6 is a wiring diagram of a SAW filter.

Hereinafter, the configurations of the SAW filters 32a and 32b will be described with reference to drawings. In addition, since the basic structures of the SAW filters 32a and 32b are preferably the same or substantially the same, the SAW filter 32b will be cited as an example and described. FIG. 4 is the appearance perspective view of the SAW filters 32a or 32b. FIG. 5 is a diagram illustrating the internal configuration of the SAW filter 32b. FIG. 6 is the wiring diagram of the SAW filter 32b. In FIG. 6, a signal line is indicated by a thick line, and a ground line is indicated by a thin line. The signal line is a wiring line through which the reception signal is transmitted, and the ground line is a wiring line kept at a ground potential.

As illustrated in FIG. 4 to FIG. 6, the SAW filter 32b includes a piezoelectric substrate 64, land electrodes (a first connection portion) 66 (66a to 66f), longitudinal coupling portions 70 and 74, parallel traps 76 and 78, and series traps 80 and 82. The piezoelectric substrate 64 is a rectangular or substantially rectangular substrate configured using lithium tantalate sodium, lithium tantalate niobate, silicon, or the like.

As illustrated in FIG. 4, the land electrodes 66 are provided on the main surface of the piezoelectric substrate 64 on the negative direction side in the z-axis direction. In more detail, along a side on a negative direction side in the y-axis direction, the land electrodes 66a to 66c are arranged in this order from a negative direction side to a positive direction side in the x-axis direction. Along a side on a positive direction side in the y-axis direction, the land electrodes 66d to 66f are arranged in this order from the negative direction side to the positive direction side in the x-axis direction. In addition, as illustrated in FIG. 2, the land electrodes 66a, 66c, and 66e are grounded through the mounting substrate 12 and the package substrate 30. The land electrode 66b is connected to the antenna through the mounting substrate 12 and the package substrate 30. Each of the land electrodes 66d and 66f is connected to the reception circuit through the mounting substrate 12 and the package substrate 30.

As illustrated in FIG. 5 and FIG. 6, between the land electrodes 66d and 66b, the longitudinal coupling portion 70 and the series trap 80 are connected in series. The longitudinal coupling portion 70 includes facing portions 70a to 70f. The ground line connected to the land electrode 66e and the signal line connected to the land electrode 66b through the series trap 80 face each other in the z-axis direction, and hence, each of the facing portions 70a, 70c, 70d, and 70f is provided. The signal line connected to the land electrode 66d and the ground line connected to the land electrode 66e face each other in the z-axis direction, and hence, each of the facing portions 70b and 70e is provided. In addition, the facing portions 70a to 70f are arranged in this order from the negative direction side to the positive direction side in the y-axis direction.

The series trap 80 is a resonator connected in series between the longitudinal coupling portion 70 and the land electrode 66b. The parallel trap 76 is a resonator connected in series between the land electrode 66d and the land electrode 66a.

Between the land electrodes 66f and 66b, the longitudinal coupling portion 74 and the series trap 82 are connected in series. The longitudinal coupling portion 74 includes facing portions 74a to 74f. The ground line connected to the land electrode 66e and the signal line connected to the land electrode 66b through the series trap 82 face in the z-axis direction, and hence, the facing portions 74a, 74c, 74d, and 74f are provided. The signal line connected to the land electrode 66f and the ground line connected to the land electrode 66e face in the z-axis direction, and hence, the facing portions 74b and 74e are provided. In addition, the facing portions 74a to 74f are arranged in this order from the negative direction side to the positive direction side in the y-axis direction.

The series trap 82 is a resonator connected in series between the longitudinal coupling portion 74 and the land electrode 66b. The parallel trap 78 is a resonator connected in series between the land electrode 66f and the land electrode 66c.

In addition, as illustrated in FIG. 5 and FIG. 6, the grounded land electrodes 66a, 66c, and 66e are connected to one another by the ground line. In other words, the land electrodes 66a, 66c, and 66e are electrically connected to the ground electrode of the SAW filter 32b.

The operation of the SAW filter 32b configured in such a way as described above will be as described below. When a reception signal has been input from the land electrode 66b through the series trap 80, a surface acoustic wave occurs in the facing portions 70a, 70c, 70d, and 70f. The surface acoustic wave travels through the surface of the piezoelectric substrate 64. The facing portions 70b and 70e convert, to a reception signal, the surface acoustic wave occurring in the facing portions 70a, 70c, 70d, and 70f. After that, the reception signal is output to the outside of the SAW filter 32b through the land electrode 66d.

In addition, the reception signal input from the land electrode 66b is input to the facing portions 74a, 74c, 74d, and 74f through the series trap 82, and a surface acoustic wave occurs in the facing portions 74a, 74c, 74d, and 74f. The surface acoustic wave travels through the surface of the piezoelectric substrate 64. The facing portions 74b and 74e convert, to a reception signal, the surface acoustic wave occurring in the facing portions 74a, 74c, 74d, and 74f. After that, the reception signal is output to the outside of the SAW filter 32b through the land electrode 66f.

Figure 7:
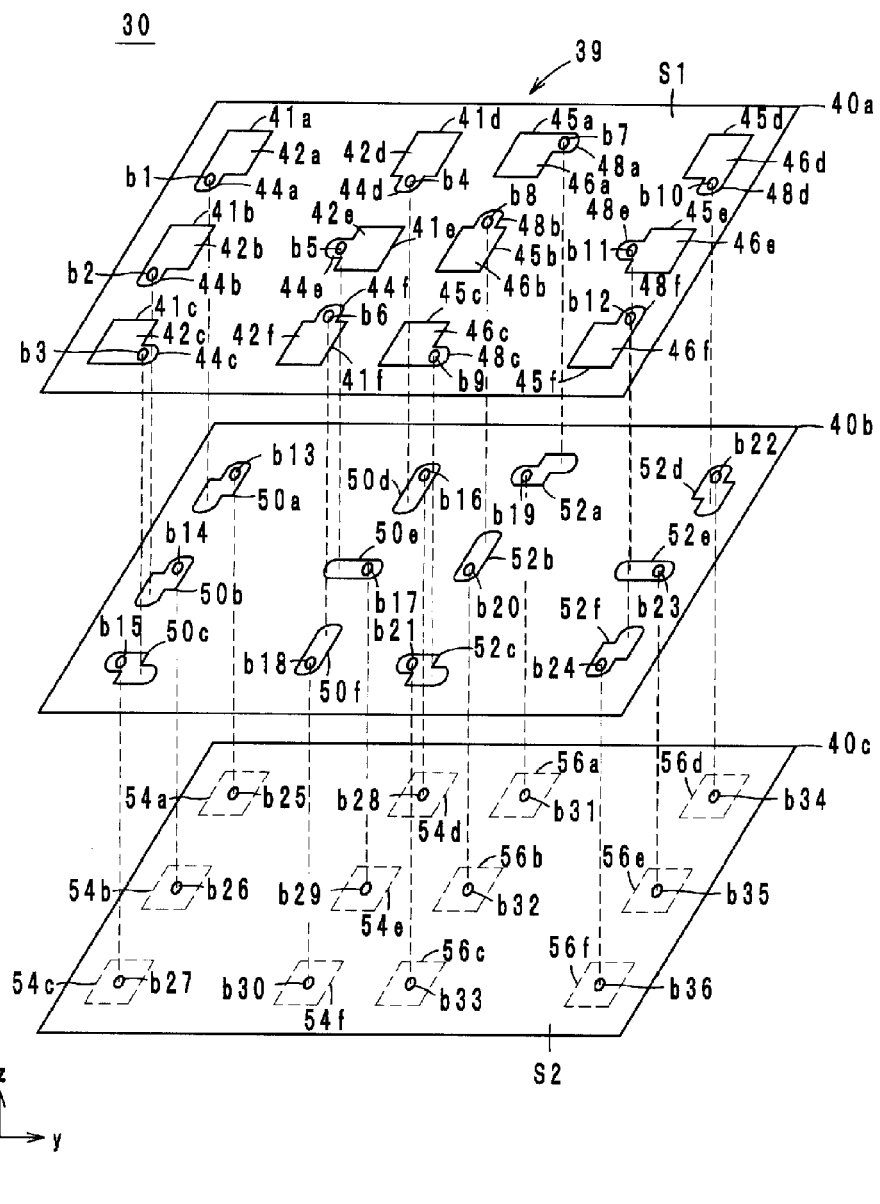
FIG. 7 is an exploded perspective view of a package substrate.

On the package substrate 30, the SAW filters 32a and 32b are mounted, and a portion of the duplexer 14 is provided. In addition, as illustrated in FIG. 1, the package substrate 30 is mounted on the main surface of the mounting substrate 12 on the positive direction side in the z-axis direction. The package substrate 30 is, for example, a resin substrate including a glass epoxy resin or the like. FIG. 7 is the exploded perspective view of the package substrate 30.

As illustrated in FIG. 7, the package substrate 30 includes a substrate body 39, land electrodes 41 (41a to 41f), 45 (45a to 45f), 54 (54a to 54f), and 56 (56a to 56f), connection conductors 50 (50a to 50f) and 52 (52a to 52f), and via hole conductors b (b1 to b36).

The substrate body 39 is a rectangular or substantially rectangular multi-layer wiring substrate including insulator layers 40a to 40c laminated on each other, the insulator layers 40a to 40c including a resin such as a glass epoxy resin. As illustrated in FIG. 7, the substrate body 39 includes main surfaces S1 and S2 facing each other. The main surface S1 is a surface located on the positive direction side in the z-axis direction, and the main surface S2 is a surface located on the negative direction side in the z-axis direction. In addition, the main surface of the insulator layer 40 on the positive direction side in the z-axis direction is referred to as a front surface, and the main surface of the insulator layer 40 on the negative direction side in the z-axis direction is referred to as a back surface.

As illustrated in FIG. 7, the land electrodes 41 (41a to 41f) are provided on the main surface S1 (in other words, the front surface of the insulator layer 40a) and used to connect with the SAW filter 32a. In more detail, along the side of the main surface S1 on the negative direction side in the y-axis direction, the land electrodes 41a to 41c are arranged in this order from the negative direction side to the positive direction side in the x-axis direction. Along a straight line located intermediate between the both sides of the main surface S1 in the y-axis direction, the land electrodes 41d to 41f are arranged in this order from the negative direction side to the positive direction side in the x-axis direction.

In addition, as illustrated in FIG. 7, the land electrodes 41 (41a to 41f) include mounting portions 42 (42a to 42f) and connection portions 44 (44a to 44f). The mounting portions 42 are preferably rectangular or substantially rectangular, and used to connect with the SAW filter 32a. The mounting portions 42a to 42f are connected to the land electrodes 62a to 62f (refer to FIG. 2 and FIG. 4), respectively, by solder bumps or the like. The connection portion 44 is a projection projecting from one of the four sides of the mounting portion 42. A via hole conductor b described later is connected to the connection portion 44.

As illustrated in FIG. 7, the land electrodes (a second connection portion) 54 (54a to 54f) are rectangular or substantially rectangular electrodes provided on the main surface S2 (in other words, on the back surface of the insulator layer 40c) and used to connect with the mounting substrate 12. In other words, via solder bumps or the like, the land electrodes 54 are connected to land electrodes (not illustrated) provided on the main surface of the mounting substrate 12 on the positive direction side in the z-axis direction. Specifically, as illustrated in FIG. 2, the land electrodes 54a, 54b, 54e, and 54f are grounded through the land electrodes of the mounting substrate 12. As illustrated in FIG. 2, the land electrode 54c is connected to the transmission circuit through the land electrode of the mounting substrate 12. As illustrated in FIG. 2, the land electrode 54d is connected to the antenna through the land electrode of the mounting substrate 12.

Along the side of the main surface S2 on the negative direction side in the y-axis direction, the land electrodes 54a to 54c are arranged in this order from the negative direction side to the positive direction side in the x-axis direction. Along a straight line located intermediate between the both sides of the main surface S2 in the y-axis direction, the land electrodes 54d to 54f are arranged in this order from the negative direction side to the positive direction side in the x-axis direction.

In addition, the land electrodes 54a to 54f overlap with the land electrodes 41a to 41f, respectively, in a planar view from the z-axis direction (in other words, the normal direction of the main surface S1). In the present preferred embodiment, in a planar view from the normal direction of the main surface S1, the land electrodes 41a to 41f overlap with the mounting portions 42a to 42f, respectively. As a result of this, the land electrodes 54 overlap with the SAW filter 32b in a planar view from the z-axis direction (the normal direction of the mounting substrate 12).

Furthermore, the land electrodes 41a to 41f and the land electrodes 54a to 54f are electrically connected to each other, the land electrodes 41a to 41f and the land electrodes 54a to 54f overlapping with each other in a planar view from the normal direction of the main surface S1. Hereinafter, a connection between the land electrodes 41 and 54 will be described.

The via hole conductors b1 to b6 individually extend in the z-axis direction so as to penetrate the insulator layer 40a. In addition, the via hole conductors b1 to b6 are connected to the connection portions 44a to 44f (the land electrodes 41a to 41f), respectively.

The via hole conductors b13 to b18 individually extend in the z-axis direction so as to penetrate the insulator layer 40b. The via hole conductors b25 to b30 individually extend in the z-axis direction so as to penetrate the insulator layer 40c. The via hole conductors b13 and b25 are connected in series to configure one via hole conductor. The via hole conductors b14 and b26 are connected in series to configure one via hole conductor. The via hole conductors b15 and b27 are connected in series to configure one via hole conductor. The via hole conductors b16 and b28 are connected in series to configure one via hole conductor. The via hole conductors b17 and b29 are connected in series to configure one via hole conductor. The via hole conductors b18 and b30 are connected in series to configure one via hole conductor. In addition, the via hole conductors b25 to b30 are connected to the land electrodes 54a to 54f, respectively.

The connection conductors 50 (50a to 50f) are provided on the front surface of the insulator layer 40b. In other words, the connection conductors 50 are built into the substrate body 39. In addition, one end of the connection conductor 50 overlaps with the connection portion 44 in a planar view from the z-axis direction. The other end of the connection conductor 50 overlaps with the land electrode 54 in a planar view from the z-axis direction. As a result of this, the connection conductors 50a to 50f relay connections between the via hole conductors b1 to b6 and the via hole conductors b13 to b18, respectively. Accordingly, the land electrodes 41a to 41f and the land electrodes 54a to 54f are electrically connected to each other, the land electrodes 41a to 41f and the land electrodes 54a to 54f overlapping with each other in a planar view from the normal direction of the main surface S1.

As illustrated in FIG. 7, the land electrodes 45 (45a to 45f) are provided on the main surface S1 (in other words, on the front surface of the insulator layer 40a), and used to connect with the SAW filter 32b. In more detail, along a straight line located intermediate between the both sides of the main surface S1 in the y-axis direction, the land electrodes 45a to 45c are arranged in this order from the negative direction side to the positive direction side in the x-axis direction. Along the side of the main surface S1 on the positive direction side in the y-axis direction, the land electrodes 45d to 45f are arranged in this order from the negative direction side to the positive direction side in the x-axis direction.

In addition, as illustrated in FIG. 7, the land electrodes 45 (45a to 45f) include mounting portions 46 (46a to 46f) and connection portions 48 (48a to 48f). The mounting portions 46 are rectangular or substantially rectangular, and used to connect with the SAW filter 32b. The mounting portions 46a to 46f are connected to the land electrodes 66a to 66f (refer to FIG. 2 and FIG. 4), respectively, by solder bumps or the like. The connection portion 48 is a projection projecting from one of the four sides of the mounting portion 46. A via hole conductor described later is connected to the connection portion 48.

As illustrated in FIG. 7, the land electrodes 56 (56a to 56f) are rectangular or substantially rectangular electrodes provided on the main surface S2 (in other words, on the back surface of the insulator layer 40c) and used to connect with the mounting substrate 12. In other words, by solder bumps or the like, the land electrodes 56 are connected to land electrodes (not illustrated) provided on the main surface of the mounting substrate 12 on the positive direction side in the z-axis direction. Specifically, as illustrated in FIG. 2, the land electrodes 56a, 56c, and 56e are grounded through the land electrodes of the mounting substrate 12. As illustrated in FIG. 2, the land electrode 56b is connected to the antenna through the land electrode of the mounting substrate 12. As illustrated in FIG. 2, the land electrode 56d is connected to the reception circuit through the land electrode of the mounting substrate 12. As illustrated in FIG. 2, the land electrode 56f is connected to the reception circuit through the land electrode of the mounting substrate 12.

Along a straight line located intermediate between the both sides of the main surface S2 in the y-axis direction, the land electrodes 56a to 56c are arranged in this order from the negative direction side to the positive direction side in the x-axis direction. Along the side of the main surface S2 on the positive direction side in the y-axis direction, the land electrodes 56d to 56f are arranged in this order from the negative direction side to the positive direction side in the x-axis direction.

In addition, the land electrodes 56a to 56f overlap with the land electrodes 45a to 45f, respectively, in a planar view from the z-axis direction (in other words, the normal direction of the main surface S1). In the present preferred embodiment, in a planar view from the normal direction of the main surface S1, the land electrodes 56a to 56f overlap with the mounting portions 46a to 46f, respectively.

Furthermore, the land electrodes 45a to 45f and the land electrodes 56a to 56f are electrically connected to each other, the land electrodes 45a to 45f and the land electrodes 56a to 56f overlapping with each other in a planar view from the normal direction of the main surface S1. Hereinafter, a connection between the land electrodes 45 and 56 will be described.

The via hole conductors b7 to b12 individually extend in the z-axis direction so as to penetrate the insulator layer 40a. In addition, the via hole conductors b7 to b12 are connected to the connection portions 48a to 48f (the land electrodes 45a to 45f), respectively.

The via hole conductors b19 to b24 individually extend in the z-axis direction so as to penetrate the insulator layer 40b. The via hole conductors b31 to b36 individually extend in the z-axis direction so as to penetrate the insulator layer 40c. The via hole conductors b19 and b31 are connected in series to configure one via hole conductor. The via hole conductors b20 and b32 are connected in series to configure one via hole conductor. The via hole conductors b21 and b33 are connected in series to configure one via hole conductor. The via hole conductors b22 and b34 are connected in series to configure one via hole conductor. The via hole conductors b23 and b35 are connected in series to configure one via hole conductor. The via hole conductors b24 and b36 are connected in series to configure one via hole conductor. In addition, the via hole conductors b31 to b36 are connected to the land electrodes 56a to 56f, respectively.

The connection conductors 52 (52a to 52f) are provided on the front surface of the insulator layer 40b. In other words, the connection conductors 52 are built into the substrate body 39. In addition, one end of the connection conductor 52 overlaps with the connection portion 48 in a planar view from the z-axis direction. The other end of the connection conductor 52 overlaps with the land electrode 56 in a planar view from the z-axis direction. As a result of this, the connection conductors 52a to 52f relay connections between the via hole conductors b7 to b12 and the via hole conductors b19 to b24, respectively. Accordingly, the land electrodes 45a to 45f and the land electrodes 56a to 56f are electrically connected to each other, the land electrodes 45a to 45f and the land electrodes 56a to 56f overlapping with each other in a planar view from the normal direction of the main surface S1.

Here, in or on the substrate body 39, the land electrodes 41a to 41f and 45a to 45f are not electrically connected. In addition, in or on the substrate body 39, the land electrodes 54a to 54f and 56a to 56f are not electrically connected.

The sealing resin 34 is configured by, for example, an epoxy resin, and arranged to cover the main surface S1 of the package substrate 30 and the SAW filters 32a and 32b, as illustrated in FIG. 3. As a result of this, the SAW filters 32a and 32b are protected by the sealing resin 34.

As illustrated in FIG. 1, the matching elements 16a to 16d preferably are chip-type electronic components mounted on the main surface of the mounting substrate 12 on the positive direction side in the z-axis direction and used to establish impedance matching between the mounting substrate 12 and the duplexer 14. As illustrated in FIG. 2, the matching elements 16a, 16b, and 16c are coils or the like connected in series between the land electrodes 54a, 54c, and 56b and a ground. The matching element 16d is a coil or the like connected between the signal line connecting the land electrode 56d and the reception circuit to each other and the signal line connecting the land electrode 56f and the reception circuit to each other.

The sealing resin 20 is arranged to cover the main surface of the mounting substrate 12 on the positive direction side in the z-axis direction, the duplexer 14, and the matching elements 16a to 16d. As a result of this, the duplexer 14 and the matching elements 16a to 16d are protected.

Figure 8:
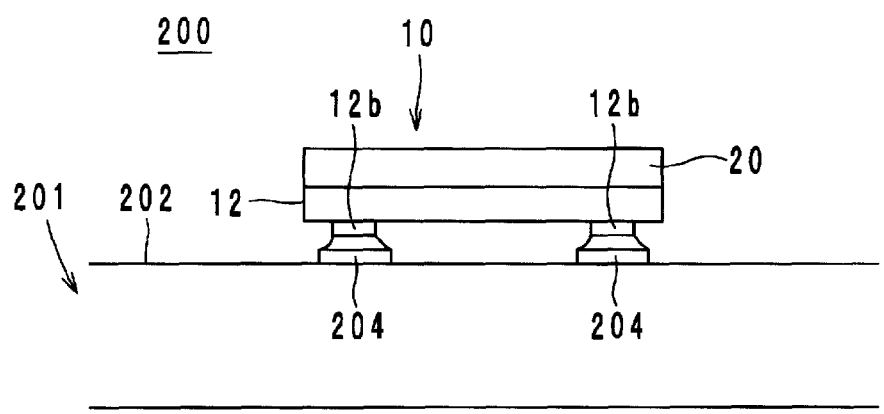
FIG. 8 is a structural view of a composite circuit module.
Figure 8:
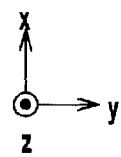
Figure 9:
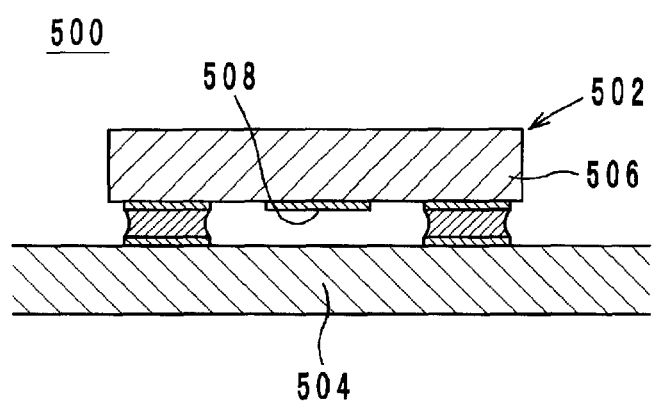
FIG. 9 is a cross-sectional structural view of an electronic component device described in Japanese Unexamined Patent Application Publication No. 2002-299996.

The circuit module 10 configured in such a way as described above is mounted on the mother substrate. Hereinafter, with reference to a drawing, a composite circuit module 200 will be described that includes the circuit module 10 and a mother substrate. FIG. 8 is the structural view of the composite circuit module 200.

A mother substrate 201 includes a substrate body 202 and land electrodes 204. The substrate body 202 is a substrate including a resin such as a glass epoxy resin. A plurality of the land electrodes 204 are provided on the surface of the substrate body 202 on the positive direction side in the z-axis direction.

The land electrode 12b on the mounting substrate 12 and the land electrode 204 on the mother substrate 201 are connected to each other by a solder. As a result of this, the mounting substrate 12 is mounted on the mother substrate 201 through the land electrode 12b.

The circuit module 10 and the composite circuit module 200, configured in such a way as described above, and the mounting substrate 12, the piezoelectric substrates 60 and 64, the package substrate 30, and the mother substrate 201 preferably have the following Young's moduli and the coefficients of linear expansion. Table 1 is a table indicating the Young's moduli of the mounting substrate 12, the piezoelectric substrates 60 and 64, the package substrate 30, and the mother substrate 201.

TABLE 1

|  | Material | Young's Modulus (Gpa) |
| --- | --- | --- |
| Piezoelectric Substrates 60 and 64 | Lithium Tantalate | 200 to 300 |
| Mounting Substrate 12 | Ceramic | 70 to 80 |
| Package Substrate 30 | Glass Epoxy Resin | 10 to 20 |
| Mother Substrate 201 | Glass Epoxy Resin | 10 to 20 |

According to Table 1, the Young's moduli of the piezoelectric substrates 60 and 64 are larger than the Young's modulus of the package substrate 30, the Young's modulus of the mounting substrate 12, and the Young's modulus of the mother substrate 201. In addition, as the materials of the piezoelectric substrates 60 and 64, the mounting substrate 12, the package substrate 30, and the mother substrate 201, materials are used whose coefficients of linear expansion are equal or approximately equal to one another. In this regard, however, when the materials indicated in Table 1 are used, the coefficients of linear expansion of the piezoelectric substrates and 64 are slightly larger than the coefficient of linear expansion of the package substrate 30, and the coefficient of linear expansion of the package substrate 30 becomes slightly larger than the coefficient of linear expansion of the mounting substrate 12.

In addition, in the electronic component device 500 described in Japanese Unexamined Patent Application Publication No. 2002-299996, aluminum oxide is used for the material of the base substance 504 corresponding to the package substrate 30. The coefficient of linear expansion of the aluminum oxide is 7 ppm/° C. Therefore, according to Table 1, a glass epoxy resin is used for the material of the package substrate 30, and hence, the coefficients of linear expansion of the piezoelectric substrates 60 and 64, the coefficient of linear expansion of the package substrate 30, the coefficient of linear expansion of the mounting substrate 12, and the coefficient of linear expansion of the mother substrate 201 become equal or approximately equal to one another.

The circuit module 10 configured in such a way as described above operates as described below. When a transmission signal is transmitted from a wireless communication device in or on which the circuit module 10 is mounted, the transmission circuit generates the transmission signal. The transmission signal passes through the duplexer 14 and is transmitted to the antenna. Here, the SAW filter 32a in the duplexer 14 has characteristics causing the transmission signal to pass between the land electrode 62c and the land electrode 62d and not causing a reception signal to pass between the land electrode 62c and the land electrode 62d. Therefore, even if the reception signal the antenna has received is input from the land electrode 62d to the SAW filter 32a, it is impossible to output the reception signal from the land electrode 62c. Therefore, intrusion of the reception signal into the transmission circuit is suppressed or prevented.

In addition, when the wireless communication device in or on which the circuit module 10 is mounted receives the reception signal, the antenna receives the reception signal. The reception signal passes through the duplexer 14 and is transmitted to the reception circuit. Here, the SAW filter 32b in the duplexer 14 has characteristics causing the reception signal to pass between the land electrode 66b and the land electrode 66d and individually outputting, from the land electrode 66d and the land electrode 66e, the reception signal input from the land electrode 66b with separating the reception signal into opposite phases. Therefore, even if the transmission signal the transmission circuit has generated is input from the land electrode 66b to the SAW filter 32b, it is impossible to output the transmission signal from the land electrode 62d.

According to the circuit module 10 and the composite circuit module 200 configured in such a way as described above, it is possible to suppress or prevent damage to a connection to or within the circuit module 10 at the time of heating or cooling in a reflow process or the like. In more detail, in the circuit module 10 and the composite circuit module 200, a resin substrate is preferably used as the package substrate 30. As a result of this, as described later, it is possible to suppress or prevent damage to solder bumps connecting the land electrodes 62 and 66 and the land electrodes 41 and 45 to each other.

In addition, in the circuit module 10 and the composite circuit module 200, bumps connecting the land electrodes 62 and 66 and the land electrodes 41 and 45 to each other are solder bumps. The solder bump is easily deformed compared with, for example, a gold bump. Therefore, even if deformations have occurred in the mounting substrate 12 and the piezoelectric substrates 60 and 64 by heating or cooling, it is difficult for the solder bump to be damaged, compared with the gold bump. As a result, in the circuit module 10 and the composite circuit module 200, it is possible to suppress or prevent damage to a connection to or within the circuit module 10. In this regard, however, the bump may also be the gold bump.

In preferred embodiments of the present invention, so as to further clarify advantages the circuit module 10 and the composite circuit module 200 achieve, a computer simulation was performed that is described below. The inventor of the present application created a first model to a fourth model, described below.

The first model: in the composite circuit module 200, the package substrate 30 was manufactured with aluminum oxide, and the gold bumps were used as the bumps connecting the land electrodes 62 and 66 and the land electrodes 41 and 45 to each other.

The second model: in the composite circuit module 200, the package substrate 30 was manufactured with aluminum oxide, and the solder bumps were used as the bumps connecting the land electrodes 62 and 66 and the land electrodes 41 and 45 to each other.

The third model: in the composite circuit module 200, the package substrate 30 was manufactured with a glass epoxy resin, and the gold bumps were used as the bumps connecting the land electrodes 62 and 66 and the land electrodes 41 and 45 to each other.

The fourth model: in the composite circuit module 200, the package substrate 30 was manufactured with a glass epoxy resin, and the solder bumps were used as the bumps connecting the land electrodes 62 and 66 and the land electrodes 41 and 45 to each other.

In addition, the first model and the second model are comparative examples, and the third model and the fourth model are examples of preferred embodiments.

Using a computer simulation, stresses were calculated that are to be applied to a gold bump or a solder bump when the above-mentioned composite circuit modules 200 of the first model to fourth model are heated. As a result, the stress of the second model became smaller than the stress of the first model by about 37%, for example. The stress of the third model became smaller than the stress of the first model by about 44%, for example. The stress of the fourth model became smaller than the stress of the first model by about 62%, for example.

According to the above-mentioned result, it is understood that the damages of connections between the land electrodes 62 and 66 and the land electrodes 41 and 45 are suppressed or prevented by changing the package substrate 30 from the aluminum oxide to the glass epoxy resin. Furthermore, it is understood that the damages of connections between the land electrodes 62 and 66 and the land electrodes 41 and 45 are also suppressed or prevented by changing the bump from the gold bump to the solder bump. In other words, as the package substrate 30, the glass epoxy resin substrate is used whose Young's modulus is small, and hence, when heat or a mechanical stress is applied to the composite circuit module, the glass epoxy resin substrate absorbs or distributes the stress. Accordingly, the stress applied to a bump portion is suppressed or prevented, and connection damage to the bump portion is suppressed or prevented. Furthermore, also as for the bump portion, the solder bump is used whose Young's modulus is smaller than the Au bump, and hence, the solder bump itself also absorbs and distributes the stress. Accordingly, connection damage is suppressed or prevented.

In addition, while it is assumed that the mounting substrate 12 is manufactured preferably with a ceramic, the mounting substrate 12 may also be a resin substrate including, for example, a glass epoxy resin or the like. As a result of this, it becomes possible to cause the coefficients of linear expansion of the piezoelectric substrates 60 and 64, the coefficient of linear expansion of the package substrate 30, and the coefficient of linear expansion of the mounting substrate 12 to be closer to one another.

As described above, preferred embodiments of the present invention are useful for a circuit module and a composite circuit module, and, in particular, superior in terms of being capable of suppressing or preventing damage to a connection to or within a device when heat is applied.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
    a surface acoustic wave filter including a piezoelectric substrate;
    a resin substrate in or on which the surface acoustic wave filter is mounted; and
    a multilayer substrate that is mounted on a mother substrate and in or on which the resin substrate is mounted; wherein
    the multilayer substrate is mounted between the mother substrate and the resin substrate;
    a coefficient of linear expansion of the piezoelectric substrate is larger than a coefficient of linear expansion of the resin substrate; and
    the coefficient of linear expansion of the resin substrate is larger than a coefficient of linear expansion of the multilayer substrate.

2. The circuit module according to claim 1, wherein a Young's modulus of the piezoelectric substrate is larger than a Young's modulus of the resin substrate and a Young's modulus of the multilayer substrate.

3. The circuit module according to claim 1, wherein the surface acoustic wave filter further includes a first connection portion arranged to mount to the resin substrate.

4. The circuit module according to claim 3, further comprising a solder bump arranged to connect the first connection portion to the resin substrate.

5. The circuit module according to claim 1, wherein
    the resin substrate includes a second connection portion arranged to mount to the multilayer substrate; and
    in a planar view from a normal direction of the multilayer substrate, the second connection portion overlaps with the surface acoustic wave filter.

6. A composite circuit module comprising:
    the circuit module according to claim 1; and
    the mother substrate on which the circuit module is mounted.

7. The composite circuit module according to claim 6, wherein a Young's modulus of the piezoelectric substrate is larger than a Young's modulus of the resin substrate, a Young's modulus of the multilayer substrate, and a Young's modulus of the mother substrate.

8. The composite circuit module according to claim 6, wherein the surface acoustic wave filter further includes a first connection portion arranged to mount to the resin substrate.

9. The composite circuit module according to claim 8, further comprising a solder bump arranged to connect the first connection portion to the resin substrate.

10. The composite circuit module according to claim 6, wherein
    the resin substrate includes a second connection portion arranged to mount to the multilayer substrate; and
    in a planar view from a normal direction of the multilayer substrate, the second connection portion overlaps with the surface acoustic wave filter.

* * * * *